United States Patent
O'Dwyer

(10) Patent No.: US 8,115,512 B1
(45) Date of Patent: Feb. 14, 2012

(54) METHOD AND APPARATUS FOR DYNAMICALLY ALIGNING HIGH-SPEED SIGNALS IN AN INTEGRATED CIRCUIT

(75) Inventor: John G. O'Dwyer, Maynooth (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/693,643

(22) Filed: Jan. 26, 2010

Related U.S. Application Data

(60) Provisional application No. 61/148,929, filed on Jan. 31, 2009.

(51) Int. Cl.
*H03K 19/177* (2006.01)
*H03K 19/00* (2006.01)

(52) U.S. Cl. .................. 326/40; 326/93; 327/161

(58) Field of Classification Search ............. 326/37–41, 326/47, 29, 93; 327/3, 161
See application file for complete search history.

(56) References Cited

U.S. PATENT DOCUMENTS

| | | | | |
|---|---|---|---|---|
| 5,740,410 | A * | 4/1998 | McDermott | 713/501 |
| 6,130,552 | A * | 10/2000 | Jefferson et al. | 326/39 |
| 6,147,531 | A * | 11/2000 | McCall et al. | 327/158 |
| 6,882,443 | B1 * | 4/2005 | McDonald | 358/1.7 |
| 7,180,332 | B2 * | 2/2007 | Di Gregorio | 326/96 |
| 7,265,587 | B1 * | 9/2007 | Ng et al. | 326/86 |

OTHER PUBLICATIONS

U.S. Appl. No. 61/148,929, filed Jan. 31, 2009, O'Dwyer et al.
U.S. Appl. No. 12/693,648, filed Jan. 26, 2010, O'Dwyer.
U.S. Appl. No. 12/694,169, filed Jan. 26, 2010, O'Dwyer et al.
Xilinx, Inc., "Dynamic Phase Alignment with ChipSync Technology in Virtex-4 FPGAs," *Xcell Journal*, Apr. 2005, pp. 72-74, Issue 52, Xilinx, Inc., San Jose, California, USA.
Xilinx, Inc., *16-Channel, DDR LVDS Interface with Real-Time Window Monitoring*, App. Note XAPP860 (v1.1), Jul. 17, 2008, pp. 1-43, Xilinx, Inc., San Jose, California, USA.

* cited by examiner

*Primary Examiner* — James H Cho
(74) *Attorney, Agent, or Firm* — Kin-Wah Tong; Lois D. Cartier

(57) ABSTRACT

A method and apparatus for dynamically aligning high-speed signals in an integrated circuit are disclosed. For example, an integrated circuit according to one embodiment includes a logic fabric and at least one input/output interface coupled to the logic fabric. The input/output interface includes a plurality of input/output sites and an edge detector coupled to the plurality of input/output sites for detecting an edge in an input signal received by the integrated circuit. A plurality of delay lines are used to determine whether the input signal arrives too early or too late compared to a clock signal in the integrated circuit, and delays in the delay lines are adjusted to align the input signal with the clock signal in the integrated circuit.

6 Claims, 5 Drawing Sheets

METHOD AND APPARATUS FOR DYNAMICALLY ALIGNING HIGH-SPEED SIGNALS IN AN INTEGRATED CIRCUIT

CROSS REFERENCE TO RELATED APPLICATIONS

This application claims the benefit of U.S. Provisional Patent Application Ser. No. 61/148,929, filed Jan. 31, 2009, which is herein incorporated by reference in its entirety.

FIELD OF THE INVENTION

This invention relates generally to a method and apparatus for dynamically aligning high-speed input signals in an integrated circuit (IC).

SUMMARY

In one embodiment, a method and apparatus for dynamically aligning high-speed signals in an integrated circuit are disclosed. For example, an integrated circuit according to one embodiment includes a logic fabric and at least one input/output interface coupled to the logic fabric. The input/output interface includes a plurality of input/output sites and an edge detector coupled to the plurality of input/output sites for detecting an edge in an input signal received by the integrated circuit.

Another embodiment provides a method of aligning an input signal to a clock signal in an integrated circuit. The method includes receiving an input signal; determining whether the input signal is arriving too early or too late via a plurality of delay lines; and using a plurality of delay lines to determine whether the input signal arrives too early or too late compared to a clock signal in the integrated circuit, and adjusting a delay of the plurality of delay lines in accordance with a result of the determining.

Also disclosed are non-transitory computer-readable storage media having stored thereon a plurality of instructions, the plurality of instructions including instructions which, when executed by a processor, cause the processor to perform the steps of the methods described herein.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION

In one embodiment, the present invention relates generally to a method and apparatus for dynamically aligning high-speed input signals in an integrated circuit (IC). One aspect of receiving a high-speed signal in an IC is the need to ensure that the signal is sampled in the center of its eye pattern. Embodiments of the invention provide an edge detector or phase detector that is built into the input/output (IO) tile of an integrated circuit. The edge detector substantially eases the burden of achieving dynamic phase alignment.

Figure 1A:
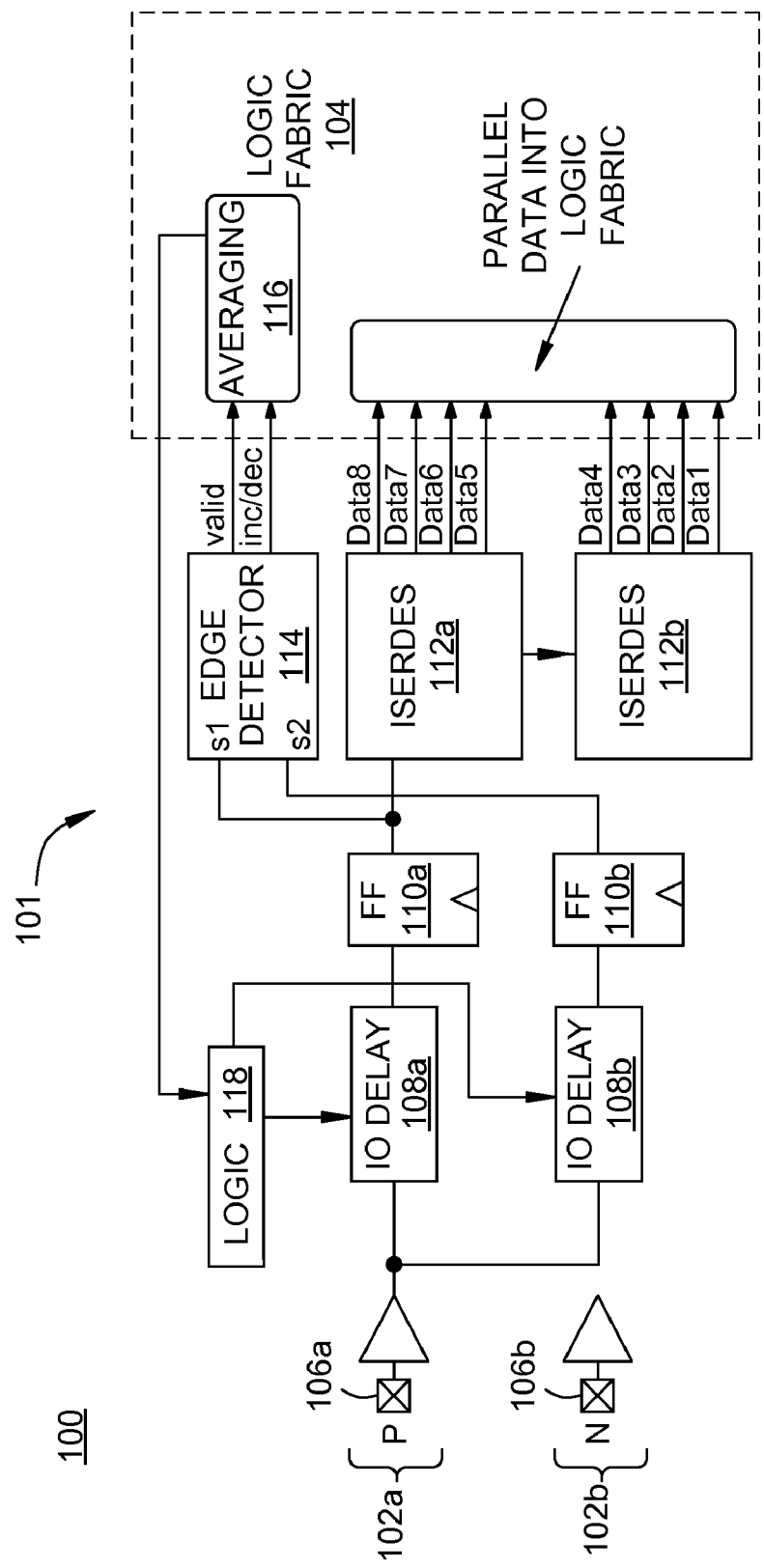
FIG. 1A is a schematic diagram illustrating one embodiment of an integrated circuit, according to the present invention.

FIG. 1A is a schematic diagram illustrating one embodiment of an integrated circuit 100, according to the present invention. The integrated circuit 100 may comprise, for example, a programmable logic device (PLD), such as a field programmable gate array (FPGA) or the like.

As illustrated, the IC 100 comprises a first IO site 102a and a second IO site 102b (collectively referred to as "IO sites 102") coupled to a logic fabric 104 (e.g., a programmable logic fabric such as a field programmable gate array (FPGA) fabric). Collectively, the first IO site 102a and the second IO site 102b form a part of an input/output (IO) interface 101 that interfaces the IO blocks (i.e., IO pins 106a and 106b) of the IC to the logic fabric 104. It should be noted that other components or modules may broadly be interpreted to be part of the IO interface as further described below. There are many such IO interfaces in the IC 100; FIG. 1 illustrates only one of them.

In one embodiment, the first IO site 102a comprises a first IO pin 106a coupled to the input of a first delay line (IODELAY) 108a. The output of the first delay line 108a is in turn coupled to the input of a first sampling flip flop 110a. In one embodiment, the first sampling flip flop 110a is a high-speed sampling flip flop. The output of the first sampling flip flop 110a is coupled to the input of a first input serializer/deserializer (ISERDES) 112a, which deserializes the input data into parallel word data. In one embodiment, the first ISERDES 112a is configured as a 1:n input deserializer (e.g., n=4 in the illustrated embodiment). The n outputs of the first ISERDES 112a are coupled to the logic fabric 104.

Similarly, the second IO site 102b comprises a second IO pin 106b. The input of a second delay line 108b, however, is coupled to the first IO pin 106a. The output of the second delay line 108b is in turn coupled to the input of a second sampling flip flop 110b. In one embodiment, the second sampling flip flop 110b is a high-speed sampling flip flop. A second input serializer/deserializer (ISERDES) 112b is coupled in a cascading manner to the first ISERDES 112a. In one embodiment, the second ISERDES 112b is configured as a 1:n input deserializer. The n outputs of the second ISERDES 112b are coupled to the logic fabric 104.

In addition, the IC 100 comprises an edge detector 114. The outputs of the first sampling flip flop 110a and the second sampling flip flop 110b are both coupled to the edge detector 114. In one embodiment, the outputs of the edge detector 114 are in turn coupled to the inputs of an optional averaging circuit 116 in the logic fabric 104. Alternatively, the averaging function can be implemented within the edge detector 114 in one embodiment as discussed below. The output of the averaging circuit 116 is coupled to the input of a logic block 118 that in one embodiment resides outside of the logic fabric 104. In other embodiments, the logic block 118 may reside within the logic fabric 104. Alternatively, the outputs of the edge detector 114 may be coupled directly to the input of the logic block 118. In turn, the outputs of the logic block 118 are coupled to the first delay line 108a and the second delay line 108b. Broadly, logic block 118 comprises delay adjustment logic for adjusting the delay for delay lines 108a and 108b as discussed below.

Two IO pins (e.g., first and second IO pins 106a and 106b) are required when using differential signaling, which provides an opportunity to combine the resources of the first IO site 102a and the second IO site 102b. This creates a larger collective IO site with double the number of data outputs (e.g., the outputs of the first ISERDES 112a and the second ISERDES 112b). With this differential configuration, the second delay line 108b and the second sampling flip flop 110b are no longer needed for processing the data. Embodiments of the invention therefore put these valuable resources (i.e., the second delay line 108b and the second sampling flip flop 110b) to other use.

Figure 1B:
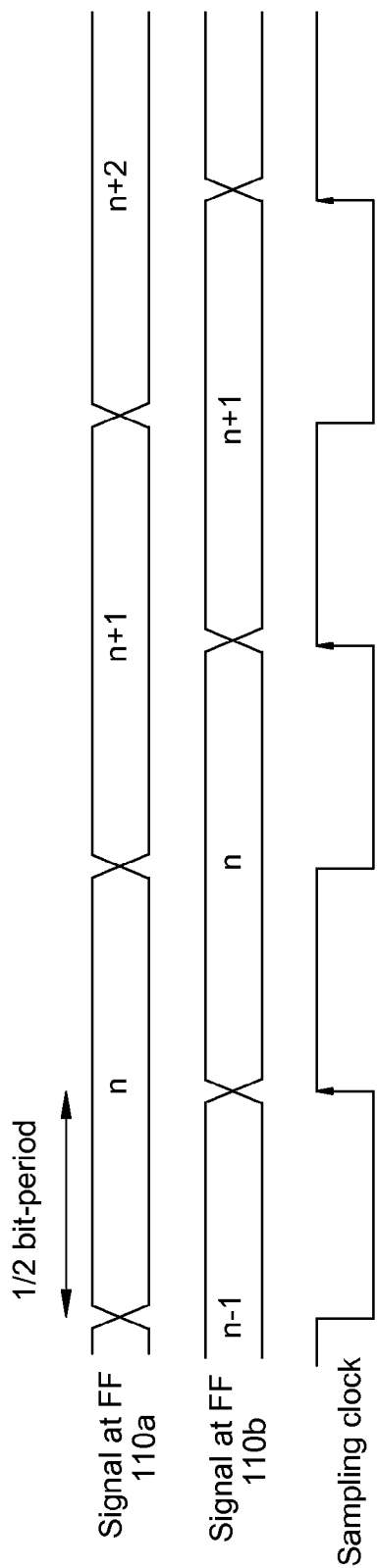
FIG. 1B illustrates the waveforms for the signals from the first and second sampling flip flops of FIG. 1 and for a sampling clock.

In particular, embodiments of the invention use the second delay line 108b and the second sampling flip flop 110b, in combination with a small amount of additional circuitry embodied in the edge detector 114, to monitor the data sampling window. In one embodiment, the second delay line 108b is configured to delay the input signal on the first IO pin 106a by half a bit-period more than the first delay line 108a delays the input signal on the first IO pin 106a. FIG. 1B, for example, illustrates the waveforms for the signals from the first and second sampling flip flops 110a and 110b of FIG. 1 and for the sampling clock. In one embodiment, the logic fabric 104 controls the logic block 118, which increments and decrements the first and second delay lines 108a and 108b, as discussed in further detail below, in order to keep the first and second delay lines 108a and 108b in lockstep.

Figure 2:
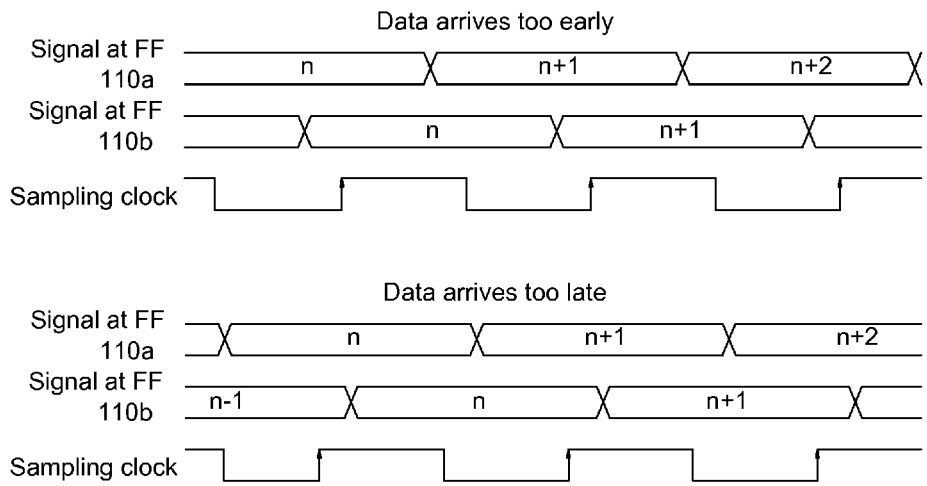
FIG. 2 is a set of waveforms illustrating the scenarios in which the input data arrives too early and in which the input data arrives too late.

In operation, when the first sampling flip flop 110a is capturing data in the center of the signal window, the second sampling flip flop 110b will be capturing data at the average transition point. The edge detector 114 takes output samples (S1 and S2, respectively) from the first sampling flip flop 110a and the second sampling flip flop 110b. The edge detector 114 then determines, from the output samples S1 and S2, whether the input data is too early or too late. In one embodiment, if S1=S2, then the edge detector 114 concludes that the input data has arrived too early. Alternatively, if S1≠S2, then the edge detector 114 concludes that the input data has arrived too late. FIG. 2 is a set of waveforms illustrating the scenarios in which the input data arrives too early and in which the input data arrives too late.

If the input data has arrived too early, then the edge detector 114 passes an increment ("inc") signal to the averaging circuit 116. The increment signal indicates that the delay lines 108a and 108b should be incremented. Alternatively, if the input data has arrived too late, then the edge detector 114 passes a decrement signal ("dec") to the averaging circuit 116. The decrement signal indicates that the delay lines 108a and 108b should be decremented.

In one embodiment, the edge detector 114 also stores the previous value of S1 and XORs it with the current value of S1 in order to determine whether an edge has occurred in the data. If no edge has occurred, the edge detector 114 deems the comparison of S1 and S2 (described above) to be invalid, and the comparison is not used by the subsequent circuitry (e.g., the averaging circuit 116 and the logic block 118). This substantially prevents erroneous output during periods in which the data does not change.

Figure 3:
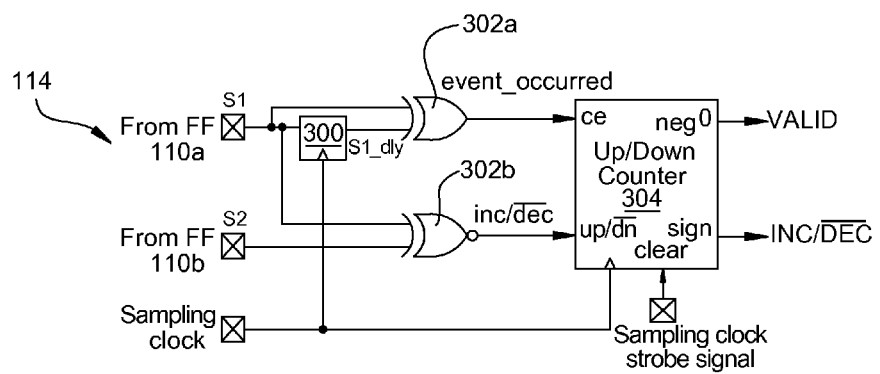
FIG. 3 is a schematic diagram illustrating one embodiment of the edge detector.

FIG. 3 is a schematic diagram illustrating one embodiment of the edge detector 114. As illustrated, the edge detector 114 comprises a flip flop 300, a first XOR gate 302a and a second XOR gate 302b, and an up/down counter 304.

In one embodiment, the inputs of the flip flop 300 are coupled to the output (signal S1) of the first sampling flip flop 110a and to the sampling clock. The output (signal S1_dly) of the flip flop 300 is coupled to the first XOR gate 302a. Thus, the flip flop 300 operates to delay the output (S1) of the first sampling flip flop 110a before it is provided to the first XOR gate 302a.

The inputs of the first XOR gate 302a are coupled to the output (signal S1) of the first sampling flip flop 110a and to the output (signal S1_dly) of the flip flop 300, as discussed above. The inputs of the second XOR gate 302b are coupled to the output (signal S1) of the first sampling flip flop 110a and to the output (signal S2) of the second sampling flip flop 110b. The outputs of both the first XOR gate 302a and the second XOR gate 302b are coupled to the up/down counter 304.

Collectively, the flip flop 300 and the first and second XOR gates 302a and 302b provide the logic to perform the comparison of the signals S1 and S2, described above. Because this circuitry is used in conjunction with the first ISERDES 112a and the second ISERDES 112b, the sampling clock may run many times faster than the clock within the logic fabric 104. In one embodiment, in order to capture all of the edge information for the logic fabric circuitry, the up/down counter 304 averages the inc/dec signal over the appropriate number of cycles (e.g., n cycles for a 1:n serializer/deserializer). The up/down counter 304 outputs an averaged signal (INC/DEC) along with a VALID signal that indicates to the averaging circuit 116 that the INC/DEC signal is valid.

There are at least two reasons why the INC/DEC signal may be invalid. First, the edge detector 114 may have received no data edges over the averaging period. Second, the edge detector 114 may have received an equal number of valid "inc" and "dec" signals. In either case, the INC/DEC signal is ignored by the averaging circuit 116.

The sampling clock strobe signal that is provided to the up/down counter 304 is an internal signal within the first ISERDES 112a and the second ISERDES 112b. The sampling clock strobe signal goes HIGH for one sampling clock cycle every n cycles. In the illustrated embodiment, the sampling clock strobe signal is used to reset the averaging circuitry so that the averaging period matches the period of the logic fabric clock.

In one embodiment, the averaging circuit 116 uses the VALID signal as an enable for the averaging circuit 116, while the INC/DEC signal causes the averaging circuit 116 to increment or decrement the first and second delay lines 108a and 108b (while maintaining the difference in delay between the delay lines, e.g., half a bit period). If the averaging circuit 116 outputs an inc signal after averaging over a sufficient number of cycles, then the delay line is incremented. If the averaging circuit 116 outputs a dec signal after averaging over a sufficient number of cycles, then the delay line is decremented. This process operates continuously in a loop to dynamically track any variation in the signal window. In one embodiment, because drift in the signaling window is typically a relatively slow process, the averaging circuit 116 may be multiplexed between many IO sites.

Figure 4:
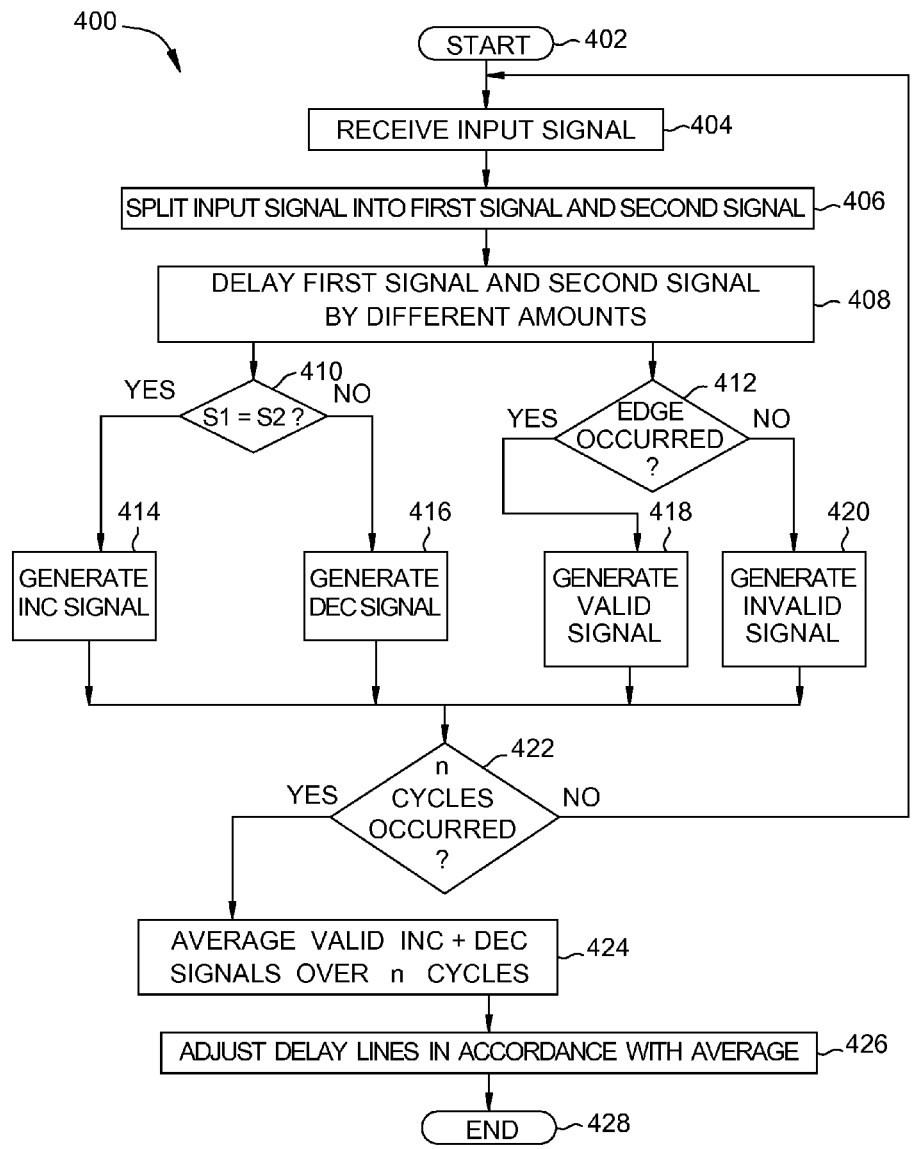
FIG. 4 is a flow diagram illustrating one embodiment of a method for dynamically aligning high-speed input signals, according to the present invention.

FIG. 4 is a flow diagram illustrating one embodiment of a method 400 for dynamically aligning high-speed input signals to a clock signal in an integrated circuit, according to the present invention. The method 400 may be implemented, for example, in the IC 100 illustrated in FIG. 1. As such, reference is made in the discussion of FIG. 4 to various elements of FIG. 1. It will be appreciated, however, that application of the method 400 is not limited to an IC having the illustrated configuration. The method 400 may, in fact, have application in ICs having alternative configurations from that as disclosed above.

The method 400 is initialized at step 402. In step 404, the first 10 pin 106a receives an input signal. In one embodiment, the input signal comprises high-speed serial data. The IC 100 then splits the input signal into a first signal (S1) and a second signal (S2) in step 406.

In step 408, the first signal and the second signal are delayed by the first delay line 108a and the second delay line 108b, respectively. In one embodiment, the first signal and the second signal are delayed by different amounts. In one particular embodiment, the second signal is delayed by half a bit-period (e.g., half a cycle of the sampling clock signal) more than the first signal.

In step 410, the edge detector 114 determines whether the first signal is equal to the second signal. In one embodiment, the first signal and the second signal are passed through the first sampling flip flop 110a and the second sampling flip flop 110b prior to being received by the edge detector. If the edge detector 114 concludes in step 410 that the first signal is equal to the second signal, then the edge detector 114 generates an increment (INC) signal in step 414. The increment signal indicates that the delay lines 108a and 108b should be incremented. Alternatively, if the edge detector 114 concludes in step 410 that the first signal is not equal to the second signal, then the edge detector 114 generates a decrement (DEC) signal in step 416. The decrement signal indicates that the delay lines 108a and 108b should be decremented.

In step 412, the edge detector 114 determines whether an edge has occurred in the input signal. If the edge detector 114 concludes in step 412 that an edge has occurred, the edge detector 412 generates a VALID signal in step 418. The VALID signal indicates that the increment or decrement signal generated in step 414 or 416 (described above) is valid and should be considered in subsequent steps of the method 400. Alternatively, if the edge detector 114 concludes in step 412 that an edge has not occurred, the edge detector 412 generates an INVALID signal in step 420. The INVALID signal indicates that the increment or decrement signal generated in step 414 or 416 (described above) is not valid and should not be considered in subsequent steps of the method 400. In one embodiment, steps 410, 414 and 416 are performed substantially in parallel with steps 412, 418 and 420.

In step 422, the edge detector 114 determines whether a predefined number of cycles, e.g., n cycles, have occurred. If the edge detector 114 concludes in step 422 that n cycles have not occurred (i.e., that less than n cycles have occurred), the method 400 returns to step 404 and proceeds as described above. Alternatively, if the edge detector 114 concludes in step 422 that n cycles have occurred, the edge detector 114 (or the averaging circuit 116 in some embodiments) averages the valid increment and decrement signals generated over the n cycles in step 424. In step 426, the logic block 118 adjusts the first and second delay lines 108a and 108b in accordance with the average generated in step 424. The method 400 then terminates in step 428. Alternatively, the method 400 may continuously loop back to step 402 and repeat for a number of iterations.

The present invention provides numerous advantages. First, building the edge detector 114 into the IO tile simplifies the logic fabric circuitry. In particular, the logic fabric 104 requires only the averaging circuit 116 in order to perform dynamic alignment of input signals. The use of dedicated circuitry also lowers the power consumption of the IC 100.

The present invention also makes efficient use of the IO tile resources in existing FPGAs. The delay lines 108a and 108b and the sampling flip flops 100a and 110b (which tend to be large and expensive) from both IO sites 102 are used. In addition, the ISERDES 112a and 112b from both IO sites 102 may be used in the data path.

Different serdes ratios are handled automatically; the outputs serve the same function, regardless of the serdes setup. Embodiments of the invention also use identical sampling flip flops to sample the data and to sample the signal edge. This automatically compensates for any offset in the setup-hold window of the flip flops with respect to the clock signal.

Further embodiments may extend the present invention by adding a dedicated counter to the output and completing the entire control loop with the IO tile.

Figure 5:
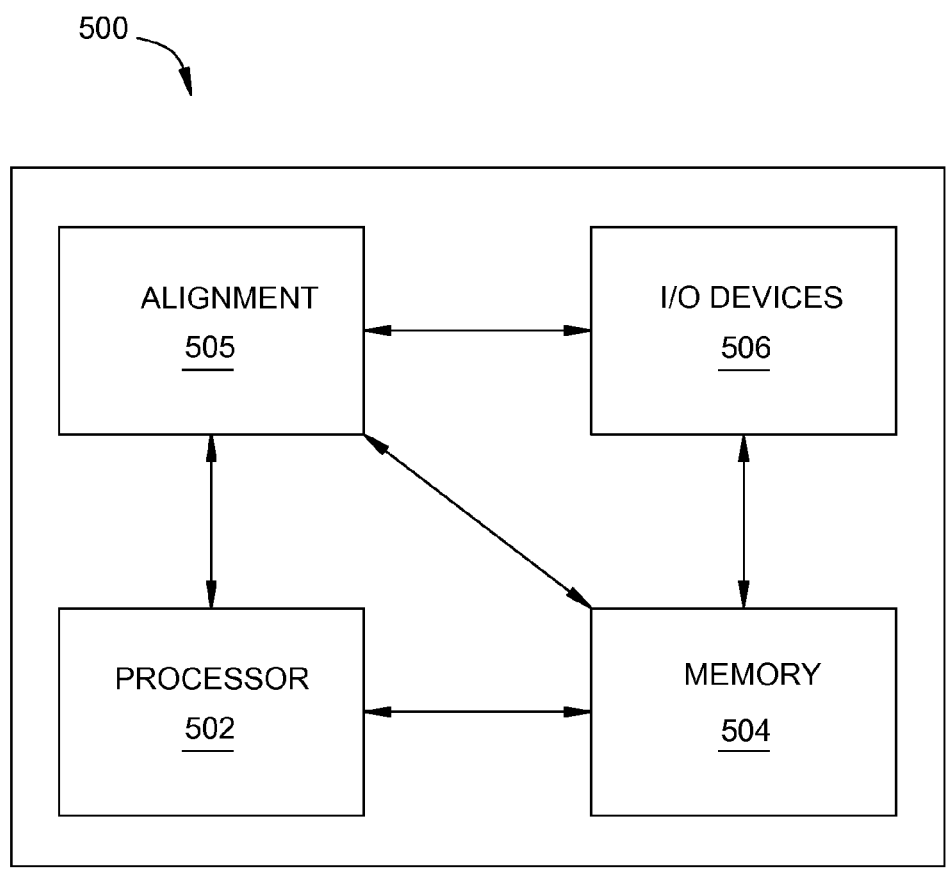
FIG. 5 depicts a high level block diagram of a general purpose computer or a computing device suitable for use in performing some or all of the functions described herein.

FIG. 5 depicts a high level block diagram of a general purpose computer or a computing device suitable for use in performing some or all of the functions described herein. As depicted in FIG. 5, the system 500 comprises a processor element or processing elements 502 (e.g., a central processing unit (CPU)), a memory 504 (e.g., a random access memory (RAM) and/or a read only memory (ROM)), an alignment module 505 for aligning high-speed input signals to an integrated circuit, and various input/output devices 506 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

Embodiments of the present invention can be implemented in software and/or in a combination of software and hardware (e.g., using application specific integrated circuits (ASIC), a general purpose computer, one or more portions of a PLD, or any other hardware equivalents such as microprocessors). In one embodiment, one or more steps of the present module or process for configuring aligning high-speed input signals to an integrated circuit may be loaded into memory 504 and executed by processor 502 to implement the functions as discussed above. As such, the present module or process 505 for aligning high-speed input signals to an integrated circuit of embodiments of the present invention can be stored on a non-transitory computer readable storage medium (e.g., RAM memory, magnetic or optical drive or diskette and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claims listing steps do not imply any order of the steps. Trademarks are the property of their respective owners.

What is claimed is:

1. An integrated circuit, comprising:
    a logic fabric; and
    at least one input/output interface coupled to the logic fabric, wherein the at least one input/output interface comprises:

a plurality of input/output sites; and
an edge detector coupled to the plurality of input/output sites for detecting an edge in an input signal received by the integrated circuit, wherein at least one output of the edge detector is coupled to an input of the logic fabric,
wherein the plurality of input/output sites comprises:
a first input/output site comprising:
a first delay line having an input for receiving the input signal;
a first sampling flip flop having an input coupled to an output of the first delay line, wherein an output of the first sampling flip flop is coupled to a first input of the edge detector; and
a first input serializer/deserializer having an input coupled to the output of the first sampling flip flop; and
a second input/output site comprising:
a second delay line having an input for receiving the input signal; and
a second sampling flip flop having an input coupled to an output of the second delay line, wherein an output of the second sampling flip flop is coupled to a second input of the edge detector.

2. The integrated circuit of claim 1, wherein the second input/output site further comprises:
a second input serializer/deserializer coupled in a cascading manner to the first input serializer/deserializer.

3. The integrated circuit of claim 2, wherein respective outputs of the first input serializer/deserializer and the second input serializer/deserializer are coupled to the logic fabric.

4. The integrated circuit of claim 1, wherein the at least one input/output interface further comprises:
a delay adjustment logic block having an input coupled to an output of the edge detector, and further having a first output coupled to the first delay line and a second output coupled to the second delay line.

5. An integrated circuit, comprising:
a logic fabric; and
at least one input/output interface coupled to the logic fabric,
wherein the at least one input/output interface comprises:
a plurality of input/output sites; and
an edge detector coupled to the plurality of input/output sites for detecting an edge in an input signal received by the integrated circuit, wherein at least one output of the edge detector is coupled to an input of the logic fabric, and
wherein the logic fabric comprises:
an averaging circuit having at least one input coupled to the at least one output of the edge detector, the averaging circuit having an output coupled to an input of a delay adjustment logic block.

6. The integrated circuit of claim 5, wherein the integrated circuit comprises a programmable logic device (PLD).

* * * * *